INVENTOR
Ladislav Beneš
BY
[signature]

INVENTOR.
Ladislav Beneš
BY
Richard Low
Ag't

INVENTOR.
Ladislav Beneš
BY
Richard ... Agt

INVENTOR.
Ladislav Beneš
BY
Richard Low
Agt

INVENTOR
Ladislav Beneš
BY
Richard Low
Ag't

United States Patent Office 3,430,078

Patented Feb. 25, 1969

3,430,078

TUNNEL DIODE CIRCUIT

Ladislav Beneš, Nove Mesto nad Vahom, Czechoslovakia, assignor to Vyskumny ustav mechanizacie a automatizacie, Nove Mesto nad Vahom, Czechoslovakia Filed Sept. 21, 1965, Ser. No. 488,864
Claims priority, application Czechoslovakia, Sept. 21, 1964, 5,233/64
U.S. Cl. 307—322 16 Claims
Int. Cl. H03k *23/36*

ABSTRACT OF THE DISCLOSURE

A first resistor and a first tunnel diode are connected in series circuit arrangement between a current supply source and a reference potential. Second and third tunnel diodes are connected in a bias-free series circuit arrangement between the junction of the first resistor and the first tunnel diode and the reference potential. A first and circuit triggering signal is applied to the junction. A second signal is applied to the junction of the second and third diodes and an output is provided at such junction.

This invention relates to detector, discriminator, and analyzing type circuits. More particularly, it relates to such improved circuits employing tunnel diodes as active elements therein.

Detection, discriminating and analyzing type circuits find wide use in many electronic circuit and system applications, particularly in pulse and measuring circuits. It is well known that a circuit comprising a pair of tunnel diodes connected in series arrangement has proven to be quite efficacious when employed as one of the aforesaid circuits. In such tunnel diode circuit, because of the unique negative resistance characteristics of the tunnel diodes, it has been found necessary to provide unidirectional current supply for the tunnel diode circuit from a source having a low internal resistance. To effect the latter, the diodes have had to be fed current from the source through a resistance divider in which a current flows which has a magnitude several times the magnitude of the current which flows through the diode. Consequently, to apply triggering pulses to the tunnel diodes in the circuit, a small inductance has to be provided which is connected between the current supply and the tunnel diodes to avoid leakage of a great part of the energy of the applied pulses to the supply source.

Accordingly, it is an important object of this invention to provide a pulse detector circuit comprising tunnel diodes which is stable in a wide range of ambient temperatures and wherein current consumption is substantially minimized.

It is another object to provide a circuit in accordance with the preceding object which is capable of operating in several modes of operation and wherein no circuit inductance component need be included between the current supply source and the tunnel diodes.

Generally speaking and in accordance with the invention there is provided a circuit comprising a current supply source, a reference potential and the series arrangement of a resistance and a first tunnel diode connected between the source and the reference potential. Also included in the circuit is the series arrangement of second and third tunnel diodes connected between the junction of the resistance of the first tunnel diode, and the reference potential. Means are provided for applying a first input signal to the aforesaid junction and for applying a second input signal to the junction of the second and third diodes, for producing an output from the circuit at the last named junction.

For a better understanding of the invention together with other and further objects thereof, reference is had to the following description taken in conjunction with the accompanying drawing. The scope of the invention is pointed out in the appended claims.

Figure 1:
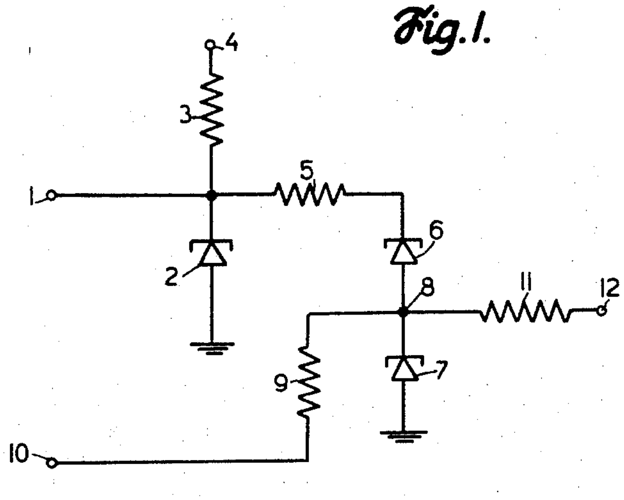
FIG. 1 is a schematic diagram of an illustrative embodiment of a circuit constructed in accordance with the principles of the invention.

Referring now to FIG. 1 wherein there is shown an illustrative embodiment of a circuit constructed in accordance with the principles of the invention, the series arrangement of the anode to cathode path of a tunnel diode 2 and a resistor 3 of a relatively large resistance magnitude is connected between a reference potential, i.e., common or ground, and unidirectional supply current source 4. The junction of tunnel diode 2 and resistor 3 is connected to the reference potential through the series arrangement of a resistor 5 and the cathode to anode paths of tunnel diodes 6 and 7 respectively. The junction 8 of tunnel diodes 6 and 7 is connected to the output terminal 12 of the circuit through a resistor 11. A terminal 10 is utilized to introduce a current into the circuit whose polarity it is desired to determine, terminal 10 being connected to junction 8 through a resistor 9. A terminal 1 connected to the junction of tunnel diode 2 and resistor 3 is the point at which triggering pulses are applied to the circuit.

Figure 2:
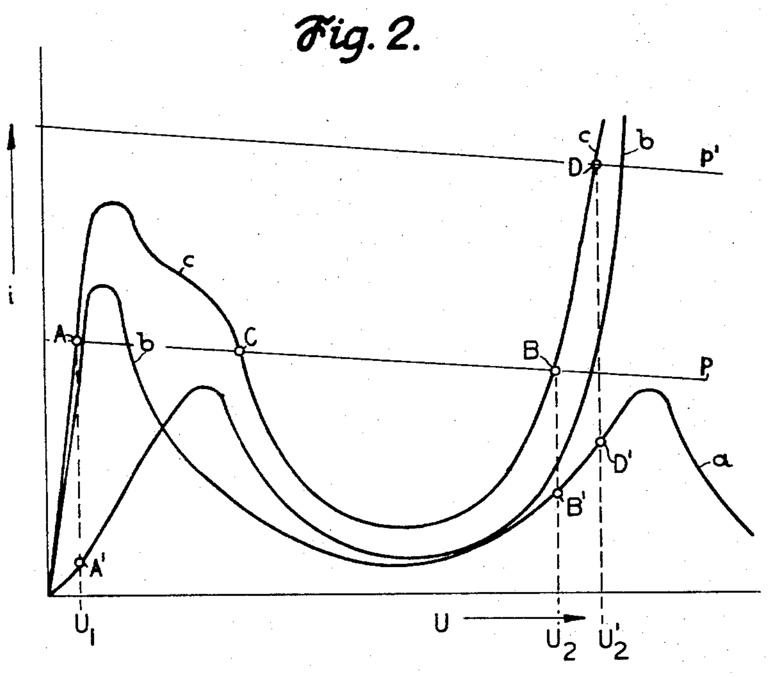
FIG. 2 is a group of voltage-current characteristic curves which obtain in the circuit of the invention.

Prior to describing the operation of the circuit of FIG. 1 in various applications, reference is made to FIG. 2 wherein there are shown the volt-ampere characteristics of tunnel diode 2, the volt-ampere characteristics of the series combination of resistor 5 and tunnel diodes 6 and 7, and the volt-ampere characteristics resulting from the combining of the foregoing characteristics.

Thus, in FIG. 2, curve $a$ is the volt-ampere characteristic of the series combination of resistor 5 and tunnel diodes 6 and 7, curve $b$ is the volt-ampere characteristic of tunnel diode 2 and curve $c$ is the resultant of the geometric addition of these characteristics. The line $p$ represents the D.C. operating load line with relation to resistor 3 when the circuit is operated in the bistable mode and the straight line $p'$ is the load line when the circuit is operated in the monostable mode of operation. It is seen that line $p$ intersects the resultant characteristic curve $c$ at points A, B, and C, points A and B occurring on positive slopes of the characteristic curve and consequently being stable points. If the operating point is chosen to be at the stable point A, the entire circuit consumes from source 4 only the amount of current as determined by point A. Such amount of current is many times smaller than the amount which is consumed in a circuit where a resistor divider is utilized.

The series arrangement of tunnel diodes 6 and 7 has supplied to it a current as determined by the voltage at point A on curve *c* so that, effectively, tunnel diode 2 may be considered as the voltage source for tunnel diodes 6 and 7, such voltage source having an internal resistance which is approximately equal to the dynamic resistance at point A. Self-evidently, as the positive slope of curve *c* at point A is quite large, the dynamic resistance at point A is commensurately quite low. Consequently, the operating point A available at the first positively sloping portion of characteristic curve *c* is essentially independent of temperature variations whereby the circuit is resistant to heat influences. Because of the circuit arrangement, particularly large magnitude resistor 3, the voltage from source 4 which is the abscissae quantity determining point A changes very slightly during excursions of the supply voltage. During voltage changes, point A moves along the slope portion of characteristic curve *c*.

In considering the operation of the circuit of FIG. 1 in the bistable mode, with a unidirectional supply voltage at terminal 4 of a suitable polarity (negative) and the application of a (negative) trigger pulse of a sufficient magnitude to terminal 1 and with the value of resistor 3 and supply source 4 chosen whereby the operating point is at location A on curve *c*, the state of the circuit is caused to switch from point A to point B on curve *c*. The current consumed from source 4 is determined by point B, the voltage $U_2$ being available to the circuit at this point. It is seen from FIG. 2 that the current taken from source 4 at point B differs only very slightly from the current as determined by point A on curve *c*. The voltage across tunnel diodes 6 and 7 is determined by point B whereby it is seen that tunnel diode 2 functions as a voltage source for diodes 6 and 7, such source having a low internal resistance since the resistance at point B is also quite low. Since point B moves up the steep slope of characteristic curve *c* during the excursions in the supply voltage, the voltage $U_2$ varies only very slightly in response to excursions. In response to ambient temperature changes, the right positively sloping portion of curve *c* changes very slightly with the point B shifting along line *p*.

In the operation of the circuit, if the operating point of diode 2 is affected by any temperature changes, the operating point of one of diodes 6 or 7 may be affected by ambient temperature changes occurring when its operating point is on the left positive slope of its voltage-current characteristic and the operating point of the other of diodes 6 or 7 may be affected by ambient temperature changes occurring when its operating point is on the right positive slope of its voltage-current characteristic. As a result thereof, the influence of temperature changes on tunnel diode 2 is substantially compensated for by the influence of temperature changes on tunnel diodes 6 and 7. The circuit at stable point B, in addition to being resistant to ambient temperature changes, is also resistant thereat to excursions of the source voltage. With the application of the triggering pulse to terminal 1, the current flows substantially only through tunnel diodes 2, 6 and 7, with a negligible portion of the current flowing through large resistor 3. It is not necessary to provide an inductor in the current supply circuit to avoid the flow of a good portion of the trigger pulse into supply source 4.

With the circuit state at point B, a triggering pulse of the appropriate polarity and magnitude applied to terminal 1 again essentially flows only through tunnel diodes 2, 6 and 7 and the circuit is switched back to its state at point A, an inductor in the circuit current supply source again being unnecessary. In the operation of the circuit in its bistable mode, resistor 5 may be omitted as desired and terminal 1 may be directly connected to tunnel diode 6.

In the monostable mode of operation of the circuit of FIG. 1, the conditions for such operation are determined by load line *p'* which intersects resulting characteristic curve *c* at the single stable point D, i.e., a point on the positively sloping portion of characteristic curve *c*. The operating voltage determined by point D is voltage $U_2'$, such voltage being, as seen in FIG. 2, only slightly greater than voltage $U_2$. The advantages of the temperature and supply voltage excursion stability of the circuit in the bistable mode of operation are preserved in the monostable mode of operation.

In the operation of the circuit in the monostable mode, i.e., with a voltage on diode 2 of $U_2'$ and the application to the circuit of a trigger pulse, the operating point D moves up or down characteristic curve *c* depending on the polarity of the pulse. If the triggering pulse which is applied to the circuit has an appropriate magnitude and polarity, the circuit is swept from its state at operating point D into its low voltage state in the left positively sloping portion of characteristic curve *c* and quite soon after the action of the trigger pulse, the state of the circuit is returned to that at operating point D. When a trigger pulse opposite in polarity to the one which sweeps the circuit to its low voltage state is applied to terminal 1, the point D moves up on characteristic curve *c*. Because of the sharp slope of the characteristic curve, voltage $U_2'$ changes very slightly as a consequence thereof. On the pair of tunnel diodes 6 and 7, connected in series arrangement at point D there is a voltage determined by point D' which increases very slightly in response to the application of the latter opposite polarity pulse to the circuit, i.e., when the point D' on curve *a* shifts to the right. Because the positive slope along which point D' moves on curve *a* is not as steep as the positive slope of curve *c* along which point D moves because of the presence of resistor 5 in the circuit, a shifting of point D' does not occur in an amount so as to pass over the right peak of curve *a* and diodes 6 and 7 maintain their states in relationship to each other, i.e., one has a lower voltage thereon and one has a higher voltage thereon. In this relationship, tunnel diode 7 may have a low voltage thereon approximately of the value of voltage $U_1$, such as about 20 millivolts, for example, or a higher voltage in the range of $U_2$–$U_1$ such as about 400 millivolts, for example, whereby the opposite voltage conditions correspondingly obtain for diode 6.

To switch the circuit of FIG. 1 in its monostable mode of operation, with the application of a trigger pulse of the appropriate polarity and magnitude to terminal 1, the operating voltage in the circuit is rapidly caused to decrease to substantially zero and thereafter the magnitude of the voltage $U_2'$ is quickly regenerated. During the regeneration, the same current at first flows through both diodes 6 and 7 and at a given moment, the current attains a magnitude equal to the peak current at which characteristic curve *c* passes from the positive resistance region into the negative resistance region. The operating points of one of diodes 6 or 7 may be brought into the negative resistance region sooner than that of the other whereby its operating voltage increases during the regeneration to attain the higher voltage, whereas a lower voltage may remain permanently on the other of diodes 6 and 7 since its operating point does not move from the left or first positively sloping portion of the characteristic. Such difference in the operation of diodes 6 and 7 occur because of the inherent differences therein. If, by chance, diodes 6 and 7 have exactly the same characteristics, inherent noise is the decisive factor in determining which diode is swept back to the higher voltage and which one remains at the lower voltage. It has been found from statistical investigation that there is a 50% probability that the higher and lower voltages will respectively occur on either of diodes 6 or 7.

The temperature dependency of the peak current is quite low and substantially identical for both of diodes 6 and 7 whereby temperature effects are mutually compensated for and the circuit of FIG. 1 is substantially independent of temperature in a wide range of ambient temperatures.

If it is desired to effect a situation where it may be ascertained as to which of diodes 6 and 7 is the first to attain the peak current value during circuit pulsing and thereby is the one that sweeps to the higher voltage state as described hereinabove, a relatively low value unidirectional current having a positive or negative polarity is supplied to junction point 8 from terminal 10. With such latter supplying, the polarity of the latter current determines which of diodes 6 and 7 is the first to sweep to the aforesaid higher voltage as is explained hereinbelow in conjunction with several of the waveforms shown in FIG. 3.

Figure 3:
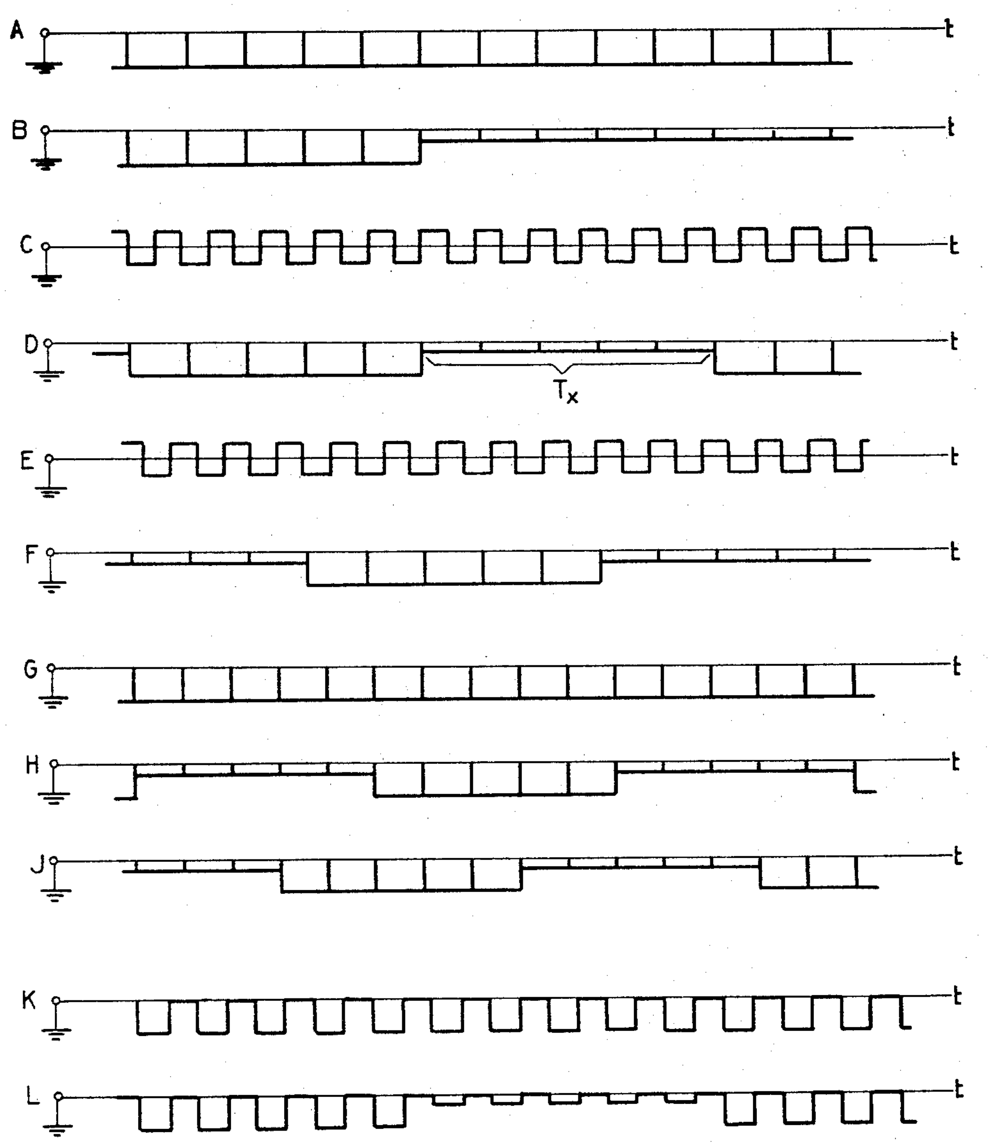
FIG. 3 is a timing diagram of various waveform inputs to and outputs from the circuit of FIG. 1 in various applications of the circuit.

In FIG. 3 line A shows a time based waveform of the pulses applied to terminal 1. If it is assumed that the upper horizontal line in this waveform is at the reference potential; that the lower horizontal line is the voltage on tunnel diode 2 and tunnel diodes 6, 7 (current source 4 is negative); that the trigger pulses have a peak level at the reference potential; and that the polarity of the current supplied to junction point 8 from terminal 10 is at first negative; then, in such situation, the corresponding voltage across diode 7 is as shown in the left portion of line B. Thereafter, if the polarity of the current supplied to terminal 8 is reversed, then the voltage across tunnel diode 7 is as is shown in the right portion of line B in FIG. 3. It is, of course, to be realized that the trigger pulses applied to the circuit as shown in line A need not be symmetrically spaced but may have irregular spacing and their repetition frequency may vary from a value near zero to values in the megacycles per second range.

The circuit of FIG. 1 operates such that by applying the trigger pulses of the appropriate polarity to terminal 1, the polarity of the current fed to junction point 8 may be determined, such determination being provided by the output produced at output terminal 12 since the voltage of such output, except for the times of occurrence of the trigger pulses, is at constant different levels for each of the polarities respectively of the current supplied to junction point 8. The resistor 11 is connected between junction point 8 and output terminal 12 in an isolating resistor prevents the output terminal 12 voltage from having any influence on the operation of tunnel diodes 6 and 7. The value of the current supplied to terminal 8 within the framework of the circuit values mentioned hereinabove is in the order of microamperes.

The circuit of FIG. 1 is suitable for use as a voltage level detector, for example, a detector of the levels of output voltages of several diverse values from a source or measuring instrument. The possible detectable level limit may be continuously adjusted by changing the bias of an auxiliary voltage source arranged in series with the device whose voltage levels are to be detected. The detector is resistant to ambient temperature changes and supply voltage excrusions.

The circuit of FIG. 1 may also conveniently be employed as a frequency detector with the information as to difference frequency between two different frequencies being available at output 12 from two input frequencies applied to terminals 1 and 10 respectively thereof. Such operation can be understood by reference to lines A, C and D of FIG. 1. If it is considered, in this connection, that the pulse repetition rate on line A is of a frequency $f_1$ and that a rectangular wave as shown in line C has a frequency $f_2$, then, during the application of each pulse on line A, there is ascertained the polarity of the pulse on line C. When frequency $f_1$ is lower than frequency $f_2$, the pulses on line A, at first, appear at moments when the half cycles of the rectangular pulses of line C have a negative value whereby a higher magnitude voltage appears at junction point 8 and also at output 12 as shown in line D. Thereafter, when the trigger pulses on line A occur during the times of the positive half cycles on line C, a low voltage is produced at output 12 as shown in line D. After such low voltage output duration period, when the pulses on line A again occur in the times of the negative half cycles on line C, the higher voltage again occurs at output 12. The output voltage changes occur at periods having the duration $T_x$ corresponding to the difference frequency $f_x=f_1-f_2$. Since, in the example shown, $f_1$ is less than $f_2$, the difference frequency $f_x$ has a negative sign.

In the event that the pulses with the frequency $f_1$ are applied to the circuit at terminal 1 in the phase shown in line A, FIG. 3, but the rectangular pulses having the frequency $f_2$ are applied as in line E, i.e., 180° displaced in phase with respect to the phase of the rectangular pulses shown in line C, then the output voltage at terminal 12 having the frequency $f_x$ as shown in line F is displaced in phase with respect to the $f_x$ output on line D.

Lines G and H of FIG. 3 show a situation where the trigger pluses applied to terminal 1 as shown in line G have a frequency $f_1$ which is greater than the frequency $f_2$ of the rectangular pulses (waveform not shown) applied to junction point 8. Line H illustrates the resulting difference frequency $f_x=f_1-f_2$ wherein $f_x$ has a positive sign. Line J shows the situation where the rectangular pulses having the lower repetition frequency $f_2$ in the immediately preceding example are displaced in phase 180° whereby the output at terminal 12 as shown in line J is displaced in phase with respect to the output shown on line H. The phase shifted outputs shown on lines F and J respectively provide information at output terminal 12 in terms of a phase shift of about ±½ of two output voltages having the same difference frequency.

The pulses are shown on lines C and E need not be of rectangular configuration, the circuit of FIG. 1 operating equally efficaciously with triangular pulses, such pulses being readily provided in a simple manner by replacing resistor 9 with a relatively large inductance and applying the rectangular pulses to junction point 8 from terminal 10 through such inductance.

In some situations, it is advantageous to employ the circuit of FIG. 1 in the bistable mode of operation. In such mode, the trigger pulses cause the switching of the states of the circuit between the stable points A and B on characteristic curve *c* of FIG. 2 and the current through tunnel diodes 6 and 7 is determined by points A′ and B′ on characteristic curve *a*. In the bistable mode of operation, with the selection of a negative unidirectional current source 4, the trigger pulse waveform having the frequency $f_1$ is as is shown in line K of FIG. 3. The rectangular pulses as shown on line C of FIG 3 are applied to junction point 8 from terminal 10. The output voltage at terminal 12 then has the waveform shown on line L and consists of groups of pulses of like polarity and of relatively high magnitude and having a repetition frequency $f_1$ respectively alternating with like width groups of relatively low magnitude pulses having the frequency $f_1$ and the aforesaid like polarity. The frequency of the alternately occurring respective groups is again the difference frequency between the frequencies of the signals on line K and line C.

The circuit of FIG. 1 is used very advantageously in its bistable mode of operation in measurement applications where the difference frequency is only up to about 5 percent of the frequency of the input. It is also possible in the bistable mode of operation to produce a two-phase output which provides information as to the sign of the difference frequency.

Figure 4:
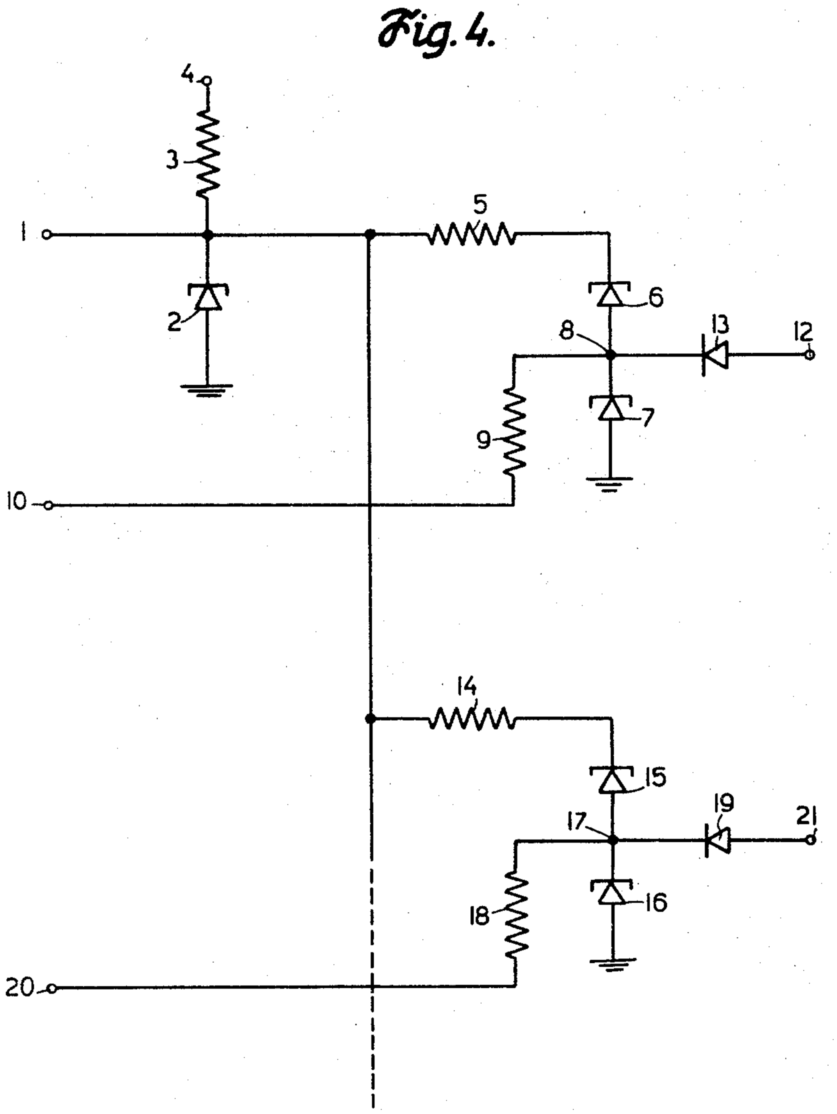
FIG. 4 is a schematic diagram of another embodiment of a circuit according to the invention and comprising a parallel arrangement of circuits substantially similar to the circuit of FIG. 1.

In FIG. 4 wherein there is shown an embodiment substantially comprising a parallel arrangement of two discrete FIG. 1 circuits respectively, the upper circuit in the arrangement of FIG. 4 is the same as that of FIG. 1 except for the fact that resistor 11 is replaced with a diode 13, oriented as shown. Accordingly, like numerals have been used to designate the circuit components in the upper circuit of the arrangement of FIG. 4 corresponding to components in the circuit of FIG. 1. In the lower circuit portion of the arrangement of FIG. 4, the input from terminal 1 is applied to the series arrangement of diodes 15 and 16 through a resistor 14. The input from terminal 20 is applied to the junction 17 of diodes 15 and 16 through a resistor 18. Junction 17 is connected to output terminal 21 through a diode 19 poled as shown. The dashed line indicates the capability of connecting more detector circuits into the parallel arrangement.

The arrangement of FIG. 4 is advantageously employed for providing a two phase output. In such employment, resistor 18 is suitably replaced by an inductance and the rectangular voltage having the frequency $f_2$ is applied to junction points 8 and 17 from terminals 10 and 20 respectively. The two-phase output voltage with the frequency $f_x$ appearing at output terminals 12 and 21 respectively may be applied to the input terminals respectively of a circuit such as shown in FIG. 1 whereby at its output there is a higher voltage where $f_1$ is greater than $f_2$ and a lower voltage where $f_1$ is less than $f_2$. Thus, a two level signal may be produced having the sign of the difference frequency $\pm f_x$.

At junction point 8 in the circuit of FIG. 1 and at junction points 8 and 17 in the circuit of FIG. 4, there appear pulses of one polarity which may be transmitted, as shown in FIG. 4, to output terminals 12 and 21 respectively through diodes 13 and 19 rather than through a resistor 11 as shown in FIG. 1. The use of diodes such as diodes 13 and 19 instead of a resistor such as resistor 11 presents the advantage that in the transmission of the voltages from the tunnel diodes' junction points, respectively, these voltages are only slightly damped by the low forward resistances of the diodes but the output terminals' voltages are isolated from affecting the respective series combination of the tunnel diodes by the high reverse resistances of the diodes.

Figure 5:
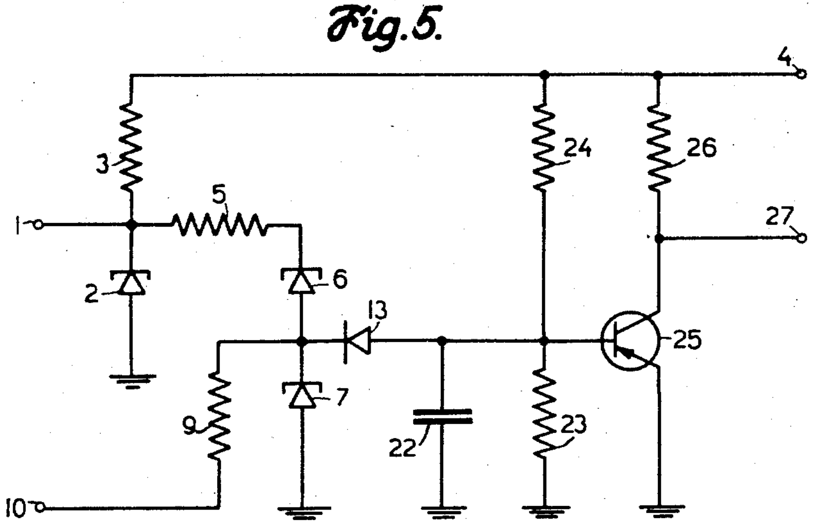
FIG. 5 is a schematic diagram of a hybrid circuit according to the invention comprising an input portion substantially similar to the circuit of FIG. 1 and a transistor output circuit.

In FIG. 5 there is shown a hybrid circuit constructed in accordance with the principles of the invention wherein the input portion is a circuit such as shown in FIG. 1 and having a diode connected between the series combination of the tunnel diodes, and the output portion comprises a transistor and its associated circuit elements. In that portion of the circuit of FIG. 5 which corresponds to the circuit of FIG. 1, corresponding circuit elements are designated with like respective numerals with the exception, of course, that a diode 13 is provided in the place of resistor 11.

In the circuit of FIG. 5, the voltage at junction point 8 is fed through diode 13 and developed across a parallel connected capacitor 22 which operates to integrate such voltage to provide a mean value voltage thereof. The output across capacitor 22 is applied to the base electrode of an output transistor 25 connected in the grounded emitter configuration. The base electrode of transistor 25 is connected to the midpoint of a voltage divider comprising the series arrangement of a resistor 24 and a resistor 23 connected between supply source 4 and common, the voltage divider providing both a suitable bias for diode 13 and for the base electrode. The emitter electrode of transistor 25 is directly connected to common and its collector is connected to source 4 through a resistor 26. The output of the circuit is taken from the collector of the transistor at terminal 27. The values of the resistors 23, 24 and 25 are so chosen whereby two values of voltage may be taken at terminal 27, viz., a voltage having essentially the voltage of source 4 when transistor 25 is in its quiescent state or a low voltage when transistor 25 is substantially fully conductive.

The circuit constructed in accordance with the invention may be utilized as a two-value indicator for an impedance bridge supplied with an alternating current voltage having a frequency equal to the repetition frequency of the trigger pulses applied to the circuit, i.e., as applied to terminal 1 in FIG. 1. In such utilization of the circuit of FIG 1, for example, the output of the impedance bridge is applied to terminal 10 and the circuit detects the phase change of the voltage in the bridge output. It is convenient in this employment of the tunnel diode detector circuit to connect the tunnel diode 2 directly into the sinusoidal or nonsinusoidal voltage oscillator whose output is the supply voltage to the bridge. The nonsinusoidal type oscillator may suitably be of the known types such as astable multivibrators, self-blocking oscillators, pulse generators, etc.

It is to be noted that the tunnel diode detector circuit of the invention has a common reference potential of zero volts and that negligibly low coupling exists between respective outputs therein. It supplies an amplifying action since the power level signal at the output exceeds the power level at the input. The circuit contains no tuned circuits and, consequently, signals with a very wide range of frequencies can be handled thereby, i.e., from frequencies near zero to the upper limit of frequencies in which tunnel diodes can be used, i.e., in the order of hundreds of megacycles per second. As has been shown hereinabove, the detector is resistant to changes in wide range of ambient temperatures, to supply voltage excursion, and to other interfering influences.

Figure 6:
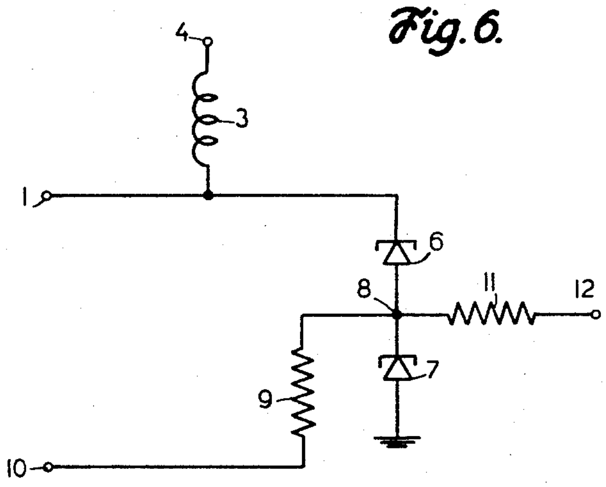
FIG. 6 is a circuit diagram of a known diode circuit.
Figure 7:
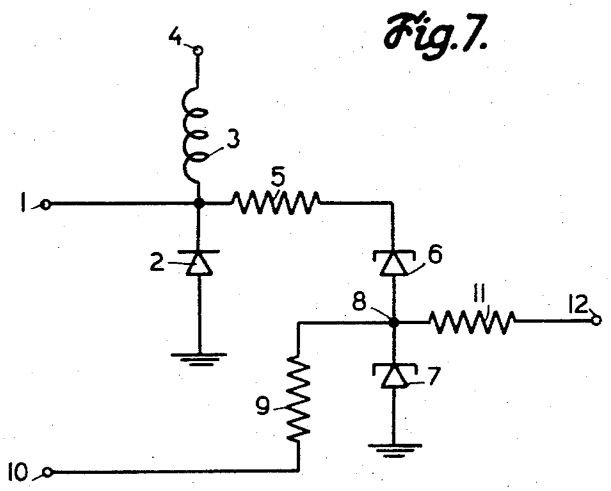
FIG. 7 is a circuit diagram of a modification of the embodiment of FIG. 1.
Figure 8:
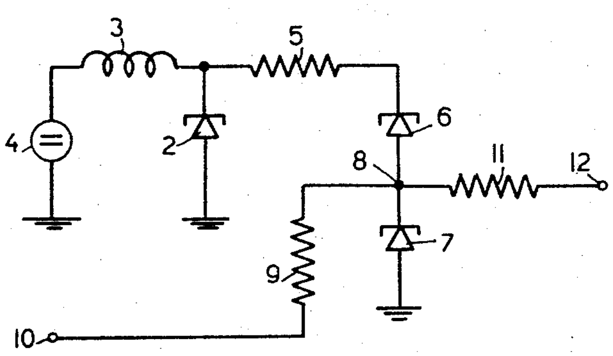
FIG. 8 is a circuit diagram of an oscillator utilizing the tunnel diode circuit of the present invention.

FIG. 6 shows schematically, as has been indicated, the known tunnel diode circuit. FIG. 7 shows a circuit which is substantially identical with that shown in FIG. 1, but has an inductor in place of a resistor in one of the inputs of the circuit. FIG. 8 shows an arrangement wherein the tunnel diode which functions as the low internal resistance voltage source for the series combination of a pair of other tunnel diodes is included in an oscillator which supplies the voltage for an impedance bridge.

While there have been described what are considered to be preferred embodiments of the invention, it will be obvious to those skilled in the art that various changes and modifications may be made therein without departing from the invention and it is, therefore, aimed in the appended claims to cover all such changes and modifications as fall within the spirit and scope of the invention.

What is claimed as new and desired to be secured by Letters Patent of the United States is:

1. A circuit comprising a current supply source, a reference potential, a first resistance and a first tunnel diode connected in series arrangement between said source and said reference potential, second and third tunnel diodes connected in a bias-free series arrangement between the junction of said first resistance and said first tunnel diode and said reference potential, first means for applying a first and circuit triggering signal to said junction, and second means for applying a second signal to the junction of said second and third diodes for producing an output from said circuit at said junction of said second and third diodes.

2. A circuit as defined in claim 1, wherein said first resistance has a resistance value which causes said circuit to operate in the bistable mode of operation.

3. A circuit as defined in claim 1, wherein said first resistance has a resistance value which causes said circuit to operate in the monostable mode of operation.

4. A circuit as defined in claim 1, wherein said second means includes a second resistance in circuit with the junction of said second and third tunnel diodes and wherein a third resistance is connected between the junction of said first tunnel diode and said first resistance and said series arrangement of said second and third tunnel diodes.

5. A circuit as defined in claim 4, wherein said circuit includes an output terminal, and further comprising a fourth resistance connected between said junction of said second and third tunnel diodes and said output terminal.

6. A circuit as defined in claim 4, wherein said circuit includes an output terminal, and further comprising a diode connected between the junction of said second and third tunnel diodes and said output terminal, said diode being reverse biased with respect to the output appearing at said output terminal.

7. A circuit comprising a current supply source, a reference potential, a first resistance and a first tunnel diode connected in series arrangement between said source and said reference potential to define a first junction therebetween, second and third tunnel diodes connected in a bias-free series arrangement between said first junction and said reference potential, said second and third tunnel diodes having a second junction therebetween, at least fourth and fifth tunnel diodes connected in a second series arrangement between said first junction and said reference potential, said fourth and fifth tunnel diodes having a third junction therebetween, first means for applying a first and circuit triggering signal to said first junction, second means for applying a second signal to said second junction, third means for applying a third signal to said third junction, first output means for deriving a first output from said second junction, and second output means for deriving a second output from said third junction.

8. A circuit as defined in claim 7, wherein said first output means includes first and second output terminals, a first diode connected between said second junction and said first output terminal and a second diode connected between said third junction and said second output terminal, said diodes being reverse biased with respect to the outputs appearing at said first and second output terminals.

9. A circuit as defined in claim 8, further comprising a second resistance connected between said first junction and said first series arrangement and a third resistance connected between said first junction and said second series arrangement, and wherein said second means includes a fourth resistance connected to said second junction and said third means includes a fifth resistance connected to said third junction.

10. A circuit as defined in claim 1, further comprising a second resistance connected between the junction of said first tunnel diode and said first resistance and said series arrangement of said second and third tunnel diodes.

11. A circuit as defined in claim 7, wherein said first resistance has a resistance value which causes said circuit to operate in the bistable mode of operation.

12. A circuit as defined in claim 7, wherein said first resistance has a resistance value which causes said circuit to operate in the monostable mode of operation.

13. A circuit comprising a current supply source, a reference potential, a first resistance and a first tunnel diode connected in series arrangement between said source and said reference potential, second and third tunnel diodes connected in a bias-free series arrangement between the junction of said first resistance and said first tunnel diode and said reference potential, first means for applying a first and circuit triggering signal to said junction, second means for applying a second signal to the junction of said second and third tunnel diodes, an output circuit, and means for applying to said output circuit a voltage at the junction of said second and third tunnel diodes.

14. A circuit as defined in claim 13, wherein said output circuit comprises an active device, and means for applying biasing potentials to said device.

15. A circuit as defined in claim 1, wherein said second signal is applied to the junction of said second and third diodes via said first tunnel diode.

16. A circuit comprising a current supply source, a reference potential, a first resistance and a first tunnel diode connected in series arrangement between said source and said reference potential, second and third tunnel diodes connected in series arrangement between the junction of said first resistance and said first tunnel diode and said reference potential, first means for applying a first and circuit triggering signal to said junction, second means for applying a second signal to the junction of said second and third tunnel diodes, an active output circuit device comprising a transistor, and means for applying to said device biasing potentials appearing at the junction of said second and third tunnel diodes, said last-mentioned means comprising a capacitor connected in parallel arrangement with the junction of said second and third diodes for integrating the voltage at said junction to provide a voltage having a magnitude which is the mean of the voltage at the said junction, and means for applying said mean voltage as an input to said transistor, said biasing potentials for said transistor causing the production at the output of said transistor of two magnitudes of voltage.

References Cited

UNITED STATES PATENTS

| | | | |
|---|---|---|---|
| 3,133,206 | 5/1964 | Bergman et al. | 307—286 X |
| 3,143,662 | 8/1964 | Hill et al. | 307—286 X |
| 3,168,652 | 2/1965 | Kaufman | 307—274 |
| 3,209,163 | 9/1965 | Wendt | 307—206 |
| 3,238,385 | 3/1966 | Schultz | 307—206 X |

OTHER REFERENCES

Collins: Tunnel Diode Circuit, December 1963, IBM Technical Disclosure Bulletin, vol. 6, No. 7, p. 71.

ARTHUR GAUSS, *Primary Examiner.*

J. D. FREW, *Assistant Examiner.*

U.S. Cl. X.R.

307—232, 233, 274, 286, 276, 206